United States Patent [19]

Matsuoka

[11] Patent Number: 5,002,499
[45] Date of Patent: Mar. 26, 1991

[54] SOCKET FOR ELECTRIC PARTS

[75] Inventor: Noriyuki Matsuoka, Tokyo, Japan

[73] Assignee: Yamaichi Electric Mfg. Co., Ltd., Tokyo, Japan

[21] Appl. No.: 429,369

[22] Filed: Oct. 31, 1989

[30] Foreign Application Priority Data

Oct. 31, 1988 [JP] Japan .................... 63-275273

[51] Int. Cl.⁵ .............................................. H01R 4/50
[52] U.S. Cl. ...................................... 439/342; 439/259
[58] Field of Search ............... 439/259, 260, 261, 262, 439/265, 266, 267, 268, 263, 264, 342, 270, 269

[56] References Cited

U.S. PATENT DOCUMENTS

| 4,331,371 | 5/1982 | Ichimura et al. | 439/266 X |
| 4,519,660 | 5/1985 | Ichimura et al. | 439/342 |
| 4,836,798 | 6/1989 | Carter | 439/268 |

FOREIGN PATENT DOCUMENTS 57-175388 11/1982 Japan .
60-52547 11/1985 Japan .

OTHER PUBLICATIONS

IBM Technical Bulletin, vol. 22, No. 5, 10–1979, (p. 1936), 4381264.

Primary Examiner—Neil Abrams
Assistant Examiner—Khiem Nguyen
Attorney, Agent, or Firm—Wenderoth, Lind & Ponack

[57] ABSTRACT

A moving mechanism of a moving plate for forming a contacting state and contact-releasing state in the socket for an electric part is characterized in including a contacting operation lever adapted to perform a horizontal movement operation of the moving plate in one direction, and a contact-releasing operation lever adapted to perform a horizontal movement operation of the moving plate in the other direction, one end of the contacting operation lever being pivotably axially supported on a side surface on one end side of the socket body, the one end of the operation lever being pivotally connected to the side surface of one end side of the moving plate by a transmission shaft, the transmission shaft being disposed such that when the contacting operation lever is pivoted about the supporting shaft, the transmission shaft renders a horizontal movement force to the moving plate so that the moving plate is moved in one direction, furthermore, one end of the contact-releasing operation lever being pivotally axially supported on a side surface of the other side of the socket body, the one end of the operating lever being pivotally connected to the side surface of the other end of the moving plate by a transmission shaft, the transmission shaft renders a horizontal movement force to the moving plate in the other direction, the contacting operation lever and the contact-releasing operation lever being laid along the side surface of the socket body.

5 Claims, 4 Drawing Sheets

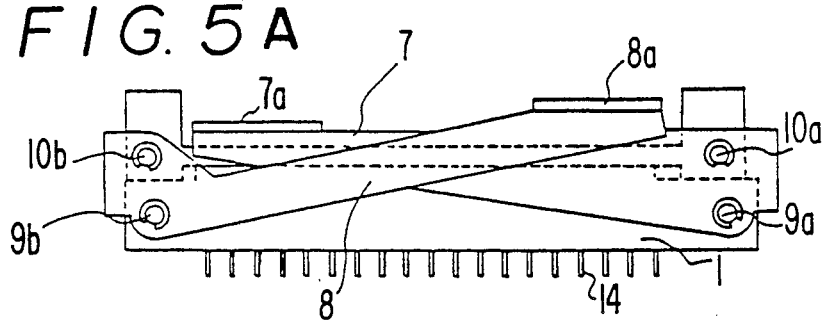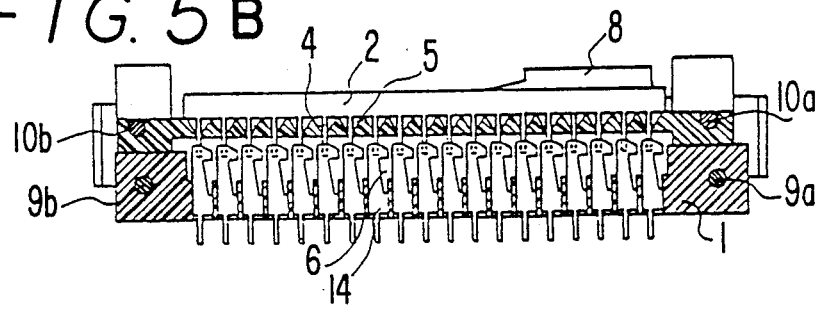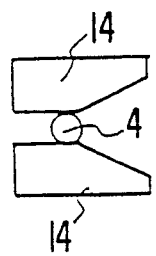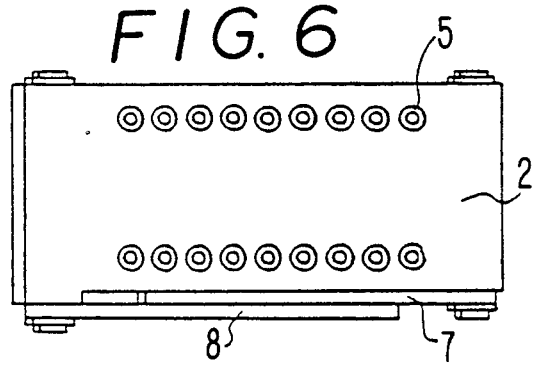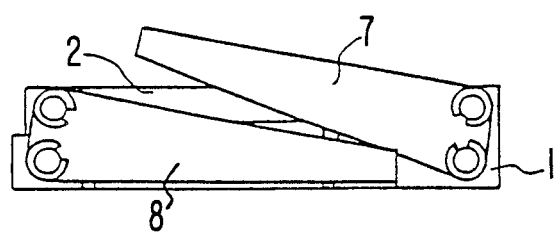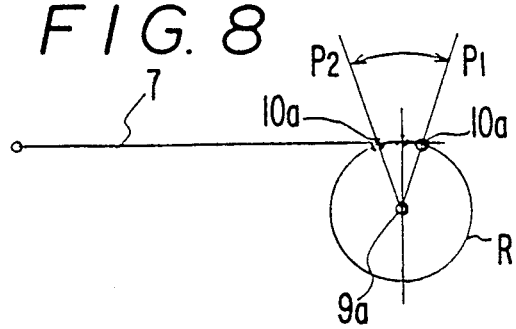

SOCKET FOR ELECTRIC PARTS

BACKGROUND OF THE INVENTION

1. Field of the Invention

This invention relates to a contacting and contact-releasing mechanism for the use in a socket for an electric part such as IC socket, and particularly to a moving mechanism for a moving plate in which the moving plate provided on the socket body is horizontally moved in order to realize a contacting state and contact-releasing state between terminals of an electric part and contacts of the socket body.

2. Brief Description of the Prior Art

Japanese Utility Model Early Laid Open Publication No. Sho 57-175388 discloses a means for realizing a contacting state and contact-releasing state, in which the moving plate and the socket body are respectively provided with pins arranged in vertical relation and projecting from both side surfaces thereof, both the pins being removably caught in a U-shaped groove which is formed in the end portion of an operation lever, said lever being pivoted rightward and leftward from its upright astriding state, thereby to render a horizontal movement force to the pins on the side of the moving plate which is snug fitted into the U-shaped groove in order to realize the contacting state and contact-releasing state.

In the arrangement disclosed in Japanese Patent Publication No. Sho 60-52547, a crank lever interposed between a moving plate and a sock body is pivoted to cause an eccentric shaft portion disposed on the interposed crank shaft portion to be acted on the moving plate in order to obtain the horizontal movement.

In the former, however, the operation lever which is astride in its upright posture on the socket body becomes the obstacle for mounting and removing the electric part such as IC or the like. As a consequence, every time the moving plate is operated to move or every time the IC is mounted or removed, the lever must be mounted or removed. Moreover, it is so troublesome because the lever must always be in possession.

Furthermore, as it is constructed such that the operation lever is pivoted rightward or leftward from its upright state in order to obtain the movement of the moving plate, it cannot employ a method for simply moving a manipulator of a robot in the vertical direction to pivot said lever, and it is therefore not suitable for an automatic moving operation of the moving plate.

Also, in the latter crank lever system, twisting is generated at the crank shaft portion which is interposed between the socket body and the moving plate and motion by the eccentric shaft portion is not correctly transmitted. As a consequence, irregularities are occurred in moving distance of the moving plate and an inferior contacting state, etc. are taken place.

Also, if the eccentric shaft portion large in order to obtain a sufficient moving distance of the moving plate, the above-mentioned twisting amount is increased, while if the bending amount is small, the swinging angle of the lever becomes necessarily large. If the swinging angle of the lever is large, the lever is brought to be in its upright state. As in the preceding example, this cannot be operated by vertical motion of a robot, etc. Furthermore, if there is an obstacle above the socket, the operation becomes difficult.

The present invention has been accomplished in order to overcome the above-mentioned problems.

SUMMARY OF THE PRESENT INVENTION

It is therefore a general object of the present invention to provide a moving mechanism of a moving plate for forming a contacting state and contact-releasing state in a socket for an electric part, in which by alternately pushing down a contacting operation lever and a contact-releasing operation lever which are laid along a socket body, the horizontal movement operation of a moving plate can be performed properly.

In order to achieve the above object, there is essentially provided, in a socket for an electric part including a socket body for connecting the electric part, and a moving plate able to horizontally move along an upper surface of said socket body, a contacting state between a terminal of said electric part and a contact of said socket body being formed by horizontal movement of said moving plate in one direction and a contact-releasing state being formed therebetween by horizontal movement of said moving plate in the other direction, a moving mechanism of a moving plate for forming a contacting state and contact-releasing state in said socket for an electric part being characterized in including a contacting operation lever adapted to perform a horizontal movement operation of said moving plate in one direction, and a contact-releasing operation lever adapted to perform a horizontal movement operation of said moving plate in the other direction, one end of said contacting operation lever being pivotably axially supported on a side surface on one end side of said socket body, said one end of said operation lever being pivotally connected (crank connection) to the side surface of one end side of said moving plate by a transmission shaft, said transmission shaft being disposed such that when said contacting operation lever is pivoted about said supporting shaft, said transmission shaft renders a horizontal movement force to said moving plate so that said moving plate is moved in one direction, furthermore, one end of said contact-releasing operation lever being pivotally axially supported on a side surface of the other side of said socket body, said one end of said operating lever being pivotally connected to the side surface of the other end side of said moving plate by a transmission shaft, said transmission shaft being disposed such that when said contact-releasing operation lever is pivoted about said supporting shaft, said transmission shaft renders a horizontal movement force to said moving plate in the other direction, said contacting operation lever and said contact-releasing operation lever being laid along the side surface of said socket body.

As means for crank connection, there is one example in which one end of each lever is axially supported on the socket body and the moving plate, each lever being pivoted about a shaft on the side of the socket body, a shaft on the side of the moving plate being pivoted about the shaft on the side of the socket body in accordance with the pivotal movement of each lever, this serving as a point of application for rendering a horizontal movement force to the moving plate.

There is another example of such means for crank connection, in which one end of each lever is axially supported either on the socket body or on the moving plate, the remaining one being connected with an engaging means such as snug-fit between an elongated groove and a slider, thereby to form the supporting point and the application point.

The contacting operation lever and the contact-releasing operation lever are crank connected at one ends thereof with each end of the socket body and the moving plate as mentioned above and laid along one side surface of two side surfaces of the socket body. The arrangement being such that when the other end (free end) of each lever is pushed down, the above-mentioned action can be obtained.

As mentioned above, when the side surface of the socket body, more particularly the free end of the contacting operation lever laid along the side surface of the superposed structure of the socket body and the moving plate, is pushed down, the operation lever is pivoted downward by serving the supporting shaft on the side of such crank connected socket body or the engaging portion as its supporting point. In accordance with the pivotal movement of the operation lever, the supporting shaft on the side of the moving plate or the engaging portion is pivoted about the supporting point. By serving this as a point of application, a horizontal movement force is rendered to the moving plate. As a result, the moving plate is moved in one direction to form a contacting state. This contacting state is obtained by bringing the terminal of an electric part which is inserted into the moving plate to a contacting position from a noncontacting position with the contact included in the socket body or by moving the moving plate in order to bring the contact from its opened position to its closed position.

On the other hand, when the free end of the contact-releasing lever is pushed down, the operation lever is pivoted downward by serving the supporting shaft on the side of such crank connected socket body or the engaging portion as its supporting point. In accordance with the pivotal movement of the operation lever, the supporting shaft on the side of the moving plate or the engaging portion is pivoted about the supporting point. By serving this as a point of application, a horizontal movement force is rendered to the moving plate. As a result, the moving plate is horizontally moved in the other direction to form a contact-releasing state. This contact-releasing state is obtained by bringing the terminal of an electric part which is inserted into the moving plate to a contacting position from a noncontacting position with the contact included in the socket body or by moving the moving plate in order to bring the contact from its opened position to its closed position in the same manner as mentioned above.

The above and other objects and attendant advantages of the present invention will be more readily apparent to those skilled in the art from a reading of the following detailed description in conjunction with the accompanying drawings which show one preferred embodiment of the invention for illustration purpose only, but not for limiting the scope of the same in any way.

BRIEF DESCRIPTION OF THE DRAWINGS

FIG. 5(A) is a side view of the socket corresponding to FIG. 2;

FIG. 5(B) is a sectional view thereof;

FIG. 5(C) is a plan view showing the relation between the contact and the lead;

FIG. 6 is a plan view of a socket showing another example;

FIG. 7 is a side view thereof;

FIGS. 8 and 9 are side views for explaining the arrangement example of the supporting point and the application point between the contacting operation lever and the contact-releasing operation lever.

DETAILED DESCRIPTION OF THE EMBODIMENT

Figure 1:
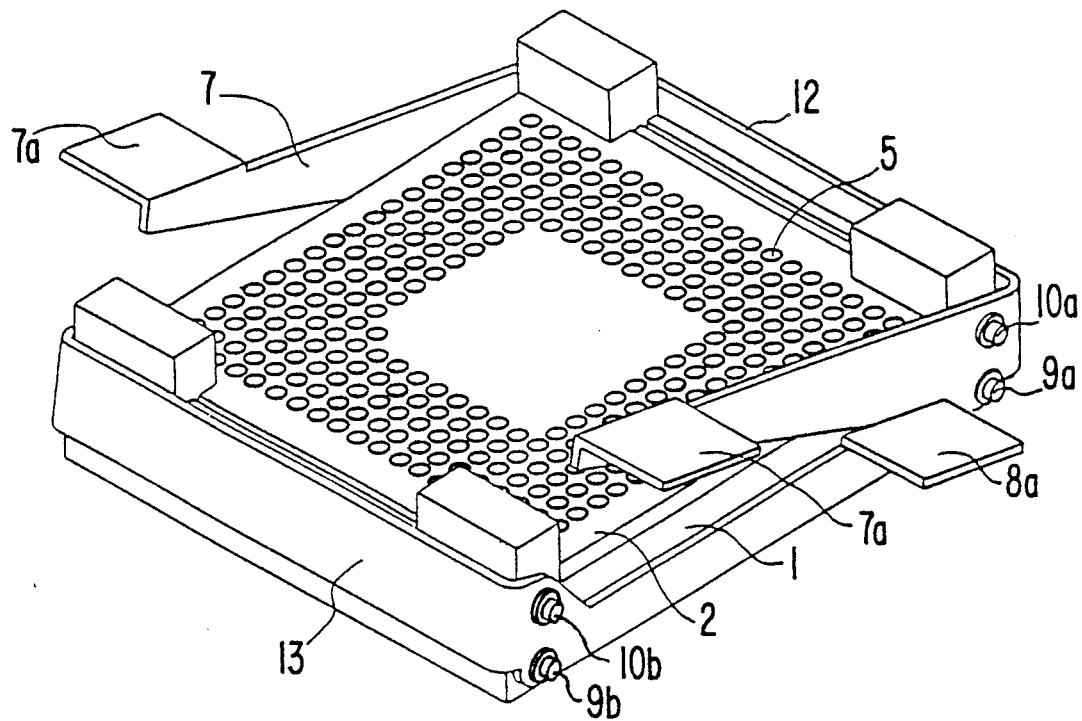
FIG. 1 is a perspective view of a socket showing the embodiment of the present invention, in which the contact-releasing lever is in its pushed-down position.
Figure 2:
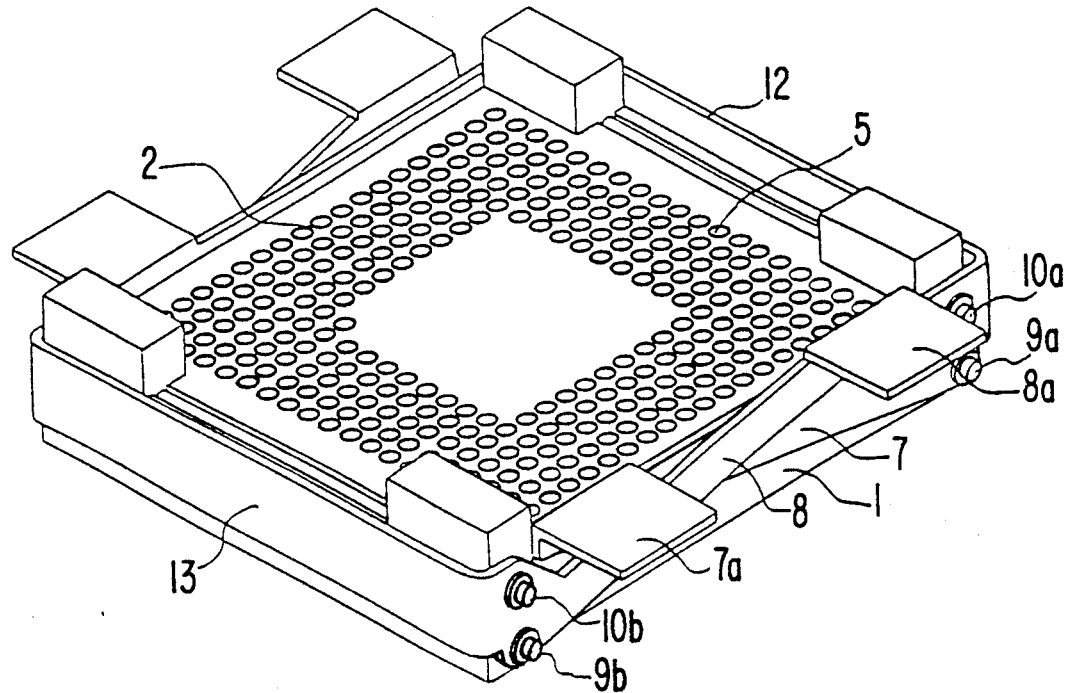
FIG. 2 is likewise a perspective view thereof, in which the contacting lever is in its pushed-down position.
Figure 3:
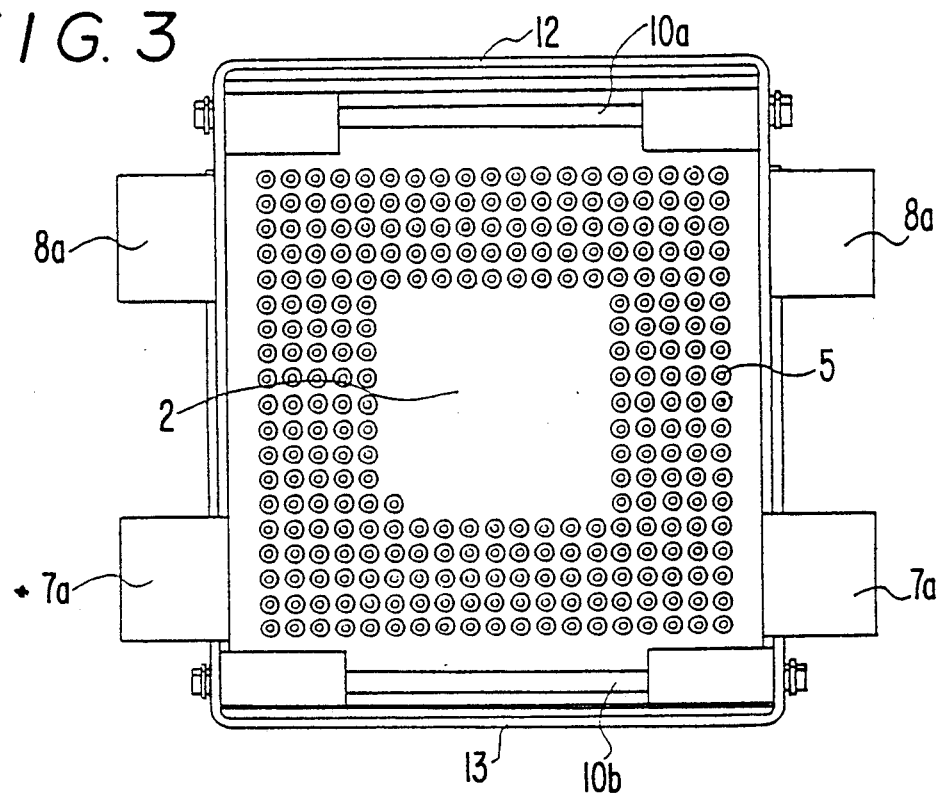
FIG. 3 is a plan view of the socket.

The embodiments of the present invention will be described hereinafter with reference to FIGS. 1 through 16.

The reference numeral 1 denotes a socket body for an electric part which is to be mounted on a distributing board or the like. The socket body 1 is provided with a moving plate 2 which is movable along its upper surface in the horizontal direction. When the moving plate 2 is horizontally moved in one direction along the upper surface of the socket body 1, a contacting state between a terminal of an electric part 3 mounted on the socket body 1 and a contact of the socket body is formed through the moving plate 2. On the other hand, when the moving plate 2 is horizontally moved in the other direction, a contact-releasing state is formed.

Figure 4A:
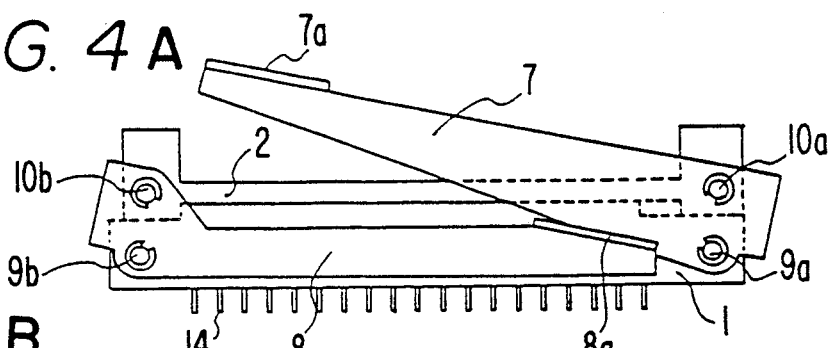
FIG. 4(A) is a side view of the socket corresponding to FIG. 1.
Figure 4B:
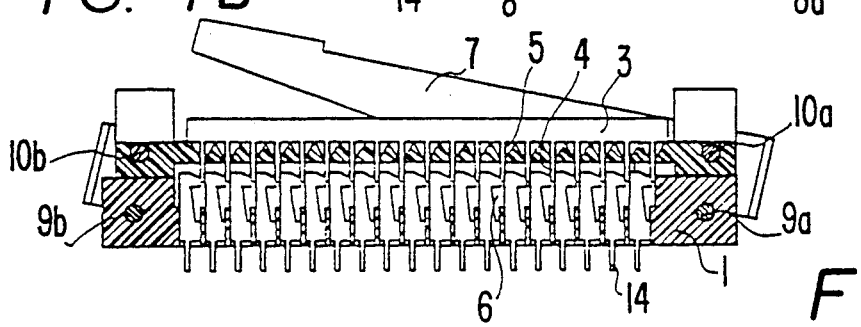
FIG. 4(B) is a sectional view thereof.
Figure 4C:
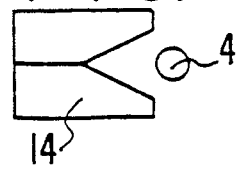
FIG. 4(C) is a plan view showing the relation between the contact and the lead.

The socket shown in the embodiment comprises a square socket body 1 formed of an insulation material, and a movable plate 2 superposed on the upper surface of the socket body 1. In FIGS. 1 through 5, the moving plate 2 is provided with a plurality of holes 5 arranged thereon in a matrix shape and adapted to permit terminals 4 of the electric part 3 to be inserted therein. In FIGS. 6 and 7, the moving plate 2 is provided with holes 5 arranged therein in parallel relation in two rows and adapted to permit the terminals 4 to be inserted therein. While mounting the electric part 3 such as IC on the upper surface of the moving plate 2, the terminals 4 are inserted into terminal inserting holes 5. Furthermore, the tips of the terminals 4 are inserted into a contact receiving chambers formed in the socket body 1 in such a manner as to correspond to the terminal inserting holes 5. As is shown in FIGS. 4(A), 4(B) and 4(C), when the moving plate 2 is horizontally moved in one direction, the terminals 4 caught in the terminal inserting holes 5 are brought to a contacting position from a contact-releasing position. On the other hand, when the moving plate 2 is horizontally moved in the other direction, the terminals 4 are brought to the contact-releasing position from the contacting position. As described above, there may be employed a method for opening and closing the contacts through the movement of the moving plate.

As means for performing a horizontal movement operation of the moving plate 2 in one direction, the socket includes a contacting operation lever 7 and as means for performing a horizontal movement operation in the other direction, it includes a contact-releasing operation lever 8.

In the embodiment shown in FIGS. 1 through 5, one end of the contacting operation lever 7 is pivotably mounted on a side surface of one end side of the socket body 1 by a supporting shaft 9a and one end of the operation lever 7 is pivotally connected to a side surface on one end side of the moving plate 2. A transmission shaft 10a is disposed as such that when the contacting operation lever 7 is pivoted by serving the supporting shaft 9a as a supporting point, the transmission shaft 10a renders a horizontal movement force in one direction to the moving plate 2. As a preferred arrangement example of the supporting shaft 9a and the transmission shaft 10a of the contacting operation lever 7, as shown in FIG. 8, an area of a predetermined angle of rotation between a point $P_1$ and a point $P_2$ with refernce to a top dead center P of a circle R about the supporting shaft 9a is a rotary area of the transmission shaft 10a. Also, the contacting operation lever 7, as shown in FIGS. 4 and 5, is stretched from the crank connecting portion toward the other end side of the socket body along the side surface of the socket body, for example, it is stretched near to a horizontal line passing the transmission shaft 10a as the point of application and as shown in FIG. 9, it is stretched near to a horizontal line passing the supporting shaft 9a, and the free end thereof is served as an operation portion 7a, that is, a point of force.

Furthermore, one end of the contact-releasing operation lever 8 is pivotably mounted on the side surface on the other end side of the socket body 1 by a supporting shaft 9b, and the other end of the operation lever 8 is pivotally connected to the side surface on the other end side of the moving plate 2 by a transmission shaft 10b.

The transmission shaft 10b is disposed as such that when the contact-releasing operation lever 8 is pivoted by serving the supporting shaft 9b as its supporting point, the transmission shaft 10b renders a horizontal movement force in the other direction to the moving plate 2.

The arrangement of the supporting shaft 9b and the transmission shaft 10b are as such that as in the previous case, the transmission shaft 10b is pivoted on the circle R about the supporting shaft 9b, and preferably between the point $P_1$ and the point $P_2$ with reference to the top dead center of the circle R.

The contact-releasing operation lever 8, as shown in FIGS. 4 and 5, is stretched from the crank connecting portion toward one side surface of the socket body along the side surface of the socket body 1, for example, it is stretched neat to the horizontal line passing the transmission shaft 10b as the point of application or near to the horizontal line passing the supporting shaft 9b, and the free end thereof is served as a push-down operation portion 8a, that is, a point of force.

Owing to the foregoing arrangement, the contacting operation lever 7 and the contact-releasing operation lever 8 are laid along the side surface of the socket body 1 from the respective crank connecting portions in the opposite directions with each other and have pushdown operation portions 7a and 8a on each end of the socket body 1. In this embodiment, the free ends of the respective operation levers are stretched in the opposite directions near to the terminal ends of the side surface of the socket body 1 so that both the operation levers are crossed each other on the side surface.

Figure 10:
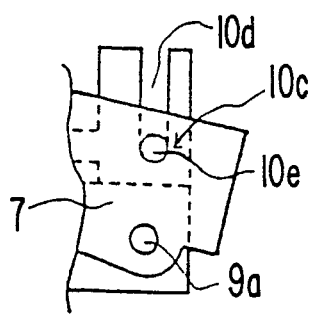
FIGS. 10 through 16 are side views of an important portion showing the connecting examples between the operation levers and the socket body and moving plate.
Figure 11:
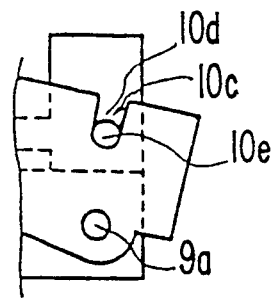

FIGS. 10 and 11 show another example of the crank connecting means of both the operation levers 7 and 8 by employing the operation lever 7 as its representative example. That is, one end of the contacting operation lever 7 is pivotably mounted on the side surface on one end side of the socket body 1 by the supporting shaft 9a, and one end of the operation lever 7 is connected to the side surface on one end side of the moving plate 2 by an engaging means 10c. The engaging means 10c is disposed as such that, as shown in FIGS. 10 and 11, either the operation lever 7 or the moving plate 2 is provided with a U-shaped groove 10d, and the other is provided with a slider 10e adapted to snug fit into the U-shaped groove 10d, and when the contacting operation lever 7 is pivoted by serving the supporting shaft 9a as the supporting point through the snug fit, it renders a horizontal movement force to the moving plate 2 in one direction. In this case, the U-shaped groove 10d is pivoted about the supporting shaft 9a, while the slider 10e is linearly moved in the horizontal movement direction.

Similarly, not shown though, one end of the contact-releasing operation lever 8 is pivotably mounted on the side surface on the other end side of the socket body 1 by the supporting shaft 9b, and one end of the operation lever 8 is pivotally connected to the side surface on the other end side of the moving plate 2 by the engaging means 10c. The engaging means 10c is disposed as such that when the contact-releasing operation lever 8 is pivoted by serving the supporting shaft 9b as its supporting point, it renders a horizontal movement force to the moving plate 2 in the other direction.

Figure 12:
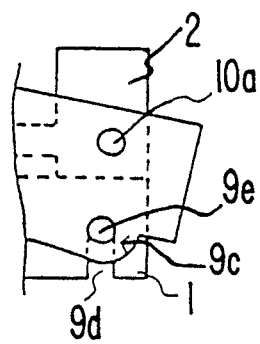
Figure 13:
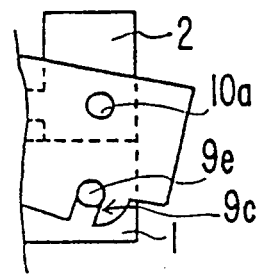

FIGS. 12 and 13 show another example of the crank connecting means between the contacting operation lever and the contact-releasing operation lever, in which one end of the contacting operation lever 7 is pivotably connected to the side surface on one end side of the socket body 1 by the engaging means 9c, and one end of the operation lever 7 is pivotally connected to the side surface on one end side of the moving plate 2 by the transmission shaft 10a.

The engaging means 9c is disposed as such that, as shown in FIGS. 12 and 13 for example, either the operation lever 7 or the moving plate 2 is provided with a U-shaped groove 9d and the other is provided with a slider 9e adapted to snug fit into the U-shaped groove, and when the contacting operation lever 7 is pivoted by serving the engaging means 9c as its supporting point, it renders a horizontal movement force to the moving plate 2 in one direction through the transmission shaft 10a.

Similarly, not shown though, one end of the contact-releasing operation lever 8 is pivotably mounted on the side surface on the other end side of the socket body 1 by the engaging means 9c, and one end of the operation lever 8 is pivotally connected to the side surface on the other end side of the moving plate 2 by the transmission shaft 10a. The transmission shaft 10a is disposed as such that when the contact-releasing operation lever 8 is pivoted through the groove and the slider as the engaging means, it renders a horizontal movement force to the moving plate 2 in the other direction.

Figure 14:
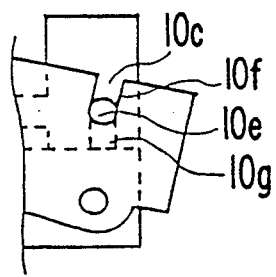
Figure 15:
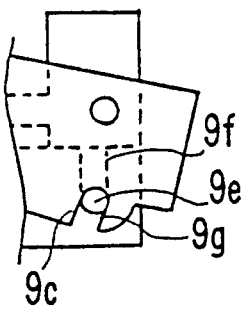

FIGS. 14 and 15 show still another example, in which both the moving plate and socket body 1 are provided with U-shaped grooves which are opened up in the opposite direction with each other, sliders 10e and 9e are held between both U-shaped grooves 10f, 10g, and 9f, 9g thereby to form the engaging means and this is made to portions corresponding to the supporting shafts 9a, 9b or the transmission shafts 10a, 10b.

Figure 16:
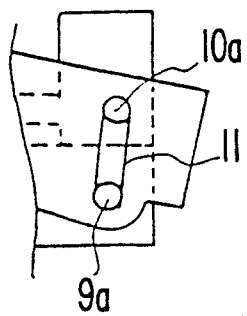

FIG. 16 shows still another example, in which a pair of the supporting shaft 9a and the transmission shaft 10a and a pair of the supporting shaft 9b and the transmission shaft 10b are snug fitted into both ends of the elongated hole 11 respectively in order to obtain the above-mentioned action.

The engaging means realized by snug fit between a cam groove and a slider or the like, such as a U-shaped groove, etc. shown in FIGS. 10 through 15 may be replaced with one of the supporting shafts 9a, 9b or one of the transmission shafts 10a, 10b in FIG. 5, and the other may be of an axially attaching structure or the like. Similarly, the example shown in FIG. 16 may be practiced in one of the operation levers.

As is shown in FIGS. 6 and 7, the contacting operation lever 7 and the contact-releasing operation lever 8 which are crank connected to both ends of the moving plate 2 of the socket body 1 in the manner as mentioned above are disposed in such a manner as to be stretched along one side surface of the socket body. Also, as is shown in FIGS. 1 through 5, the contacting operation lever 7 and the contact-releasing operation lever 8 are disposed in such a manner as to be stretched in symmetry along two opposite side surfaces. In this case, a pair of contacting operation levers 7 stretched along the two opposite side surfaces of the socket body 1 are connected with each other at the end portion of the operation lever 7. Similarly, a pair of contact-releasing operation lever 8 stretched along the two opposite side surfaces of the socket body are connected with each other at the end portion of the operating lever 8. FIGS. 1 through 5 show one example in which the end portions of both the operation levers on the crank connecting portion side are connected by connecting plates 12 and 13, and the connecting plates 12, 13 are stretched along the other (remaining) two side surfaces of the socket body. The both levers may be connected on the side of the push down operating portions 7a, 8a.

The operation will now be described with reference to FIGS. 4 and 5.

First, when the push down operating portion 7a of the contacting operation lever 7 is pushed down from an upper position shown in FIG. 4 to a lower position shown in FIG. 5, the operation lever 7 is pivoted counterclockwise by serving the supporting axis 9a as its supporting point. In accordance with the pivotal movement of the operation lever 7, the transmission shaft 10a is pivoted counterclockwise about the supporting shaft 9a, thereby to render a moving force to the moving plate 2 from the right hand side to the left-hand side in the figures in order to horizontally move the moving plate 2 in one direction. As a result, the terminals 4 of the electric part 3 mounted on the moving plate 2 are brought from the noncontacting position to the contacting position. As a result, the terminals 4 are held by the contacts 14 to realize a contacting state as shown in FIGS. 5(B) and 5(C). At this time, the contact-releasing operation lever 8 is pivoted from the lower position shown in FIG. 4(A) to the upper position shown in FIG. 5(A) when the transmission shaft 10b is pressed by the moving plate 2 and pivoted counterclockwise about the supporting shaft 9b. As a result, the contact-releasing operation lever 8 is brought to be in a push-down waiting state.

Also, when the push-down operating portion 8a of the contact-releasing operation lever 8 is pushed down from the upper push-down waiting position shown in FIG. 5(A) to the lower position shown in FIG. 4(A), the operation lever 8 is pivoted clockwise by serving the supporting shaft 9b as its supporting point. When the operation lever 8 is pivoted clockwise, the transmission shaft 10b is pivoted clockwise about the supporting shaft 9b, thereby to render a moving force to the moving plate 2 in the right-hand direction in the figures in order to horizontally move the same in the other direction. As a result, the terminals 4 of the electric part 3 mounted on the moving plate 2 are horizontally moved from its contacting position to its contact-releasing position with respect to the contacts 14, and are brought to be in an escaped state from the contacts 14 as shown in FIGS. 4(B) and 4(C). In the foregoing state, a noload insertion and removal of the electric part 3 is performed. At this time, when the transmission shaft 10a is pressed by the moving plate 2 and pivoted clockwise about the supporting shaft 9a, the contacting operation lever 7 is pivoted from the lower position shown in FIG. 5(A) to the upper position shown in FIG. 4(A) and brought to be in a push-down waiting state.

As described in the foregoing, according to the present invention, by alternately pushing down the contacting operation lever and the contact-releasing operation lever which are laid along the side surface of the socket body, the moving plate is horizontally moved in the right-hand direction or in the left-hand direction and the above-mentioned contacting state and contact-releasing state can be realized properly and efficiently.

Also, according to the present invention, there can be effectively overcome the problems such as irregularity of moving distance and inferior contacting state which are caused by twisting of the shaft of the prior art which uses a crank lever as movement operating means of the moving plate. Moreover, by a small push-down force, there can be obtained a sufficient moving distance of the moving plate and the contacting position and the contact-releasing position can be obtained properly.

Also, the present invention effectively overcome the problem of the prior art in that a movement operating portion disposed above the moving plate interferes a smooth mounting and removal of the electric part. According to the present invention, the contacting state and the contact-releasing state can be effectively performed simply by alternately pushing down the both operation levers laid along the side surfaces of the socket body and thus suitably applicable to automation by robot, etc.

While particular embodiments of the present invention have been shown in the drawings and described above, it will be apparent that many changes may be made in the form, arrangement and positioning of the various elements of the combination. In consideration thereof, it should be understood that preferred embodiments of this invention disclosed herein are intended to be illustrative only and not intended to limit the scope of the present invention.

What is claimed is:

1. In a socket for an electric part including a socket body for connecting the electric part, and a moving plate able to horizontally move along an upper surface of said socket body, a contacting state between a terminal of said electric part and a contact of said socket body being formed by horizontal movement of said moving plate in one direction and a contact-releasing state being formed therebetween by horizontal movement of said moving plate in the other direction, a moving mechanism of a moving plate for forming a contacting state and contact-releasing state in said socket for an electric part being characterized in including a contacting operation lever adapted to perform a horizontal movement operation of said moving plate in one direction, and a contact-releasing operation lever adapted to perform a horizontal movement operation of said moving plate in the other direction, one end of said contacting operation lever being pivotably axially supported by a supporting shaft on a side surface on one end side of said socket body, said one end of said operation lever being pivotally connected to the side surface of one end side of said moving plate by a transmission shaft, said transmission shaft being disposed such that when said contacting operation lever is pivoted about said supporting shaft, said transmission shaft renders a horizontal movement force to said moving plate so that said moving plate is moved in one direction, furthermore, one end of said contact-releasing operation lever being pivotally axially supported by a supporting shaft on a side surface of the other side of said socket body, said one end of said operating lever being pivotally connected to the side surface of the other end side of said moving plate by a transmission shaft, said transmission shaft being disposed such that when said contact-releasing operation lever is pivoted about said supporting shaft, said transmission shaft renders a horizontal movement force to said moving plate in the other direction, said contacting operation lever and said contact-releasing operation lever being laid along the side surface of said socket body.

2. A moving mechanism of a moving plate for forming a contacting state and contact-releasing state in a socket for an electric part as claimed in claim 1, which includes engaging means instead of one of said transmission shafts or one of said supporting shafts.

3. A moving mechanism of a moving plate for forming a contacting state and contact-releasing state in a socket for an electric part as claimed in claim 1 or claim 2, wherein said contacting operation lever and said contact-releasing operation lever being laid along one side surface of said socket body.

4. A moving mechanism of a moving plate for forming a contacting state and contact-releasing state in a socket for an electric part as claimed in claim 1 or claim 2, wherein said contacting operation lever and said contact-releasing operation lever being laid along two opposite side surfaces of said socket body.

5. A moving mechanism of a moving plate for forming a contacting state and contact-releasing state in a socket for an electric part as claimed in claim 4, wherein a pair of said contacting operation levers laid along said two opposite side surfaces of said socket body are connected with each other at one end portion thereof, and a pair of said contact-releasing operation levers laid along said two opposite side surfaces of said socket body are connected with each other at one end portion thereof.

* * * * *